United States Patent
Liu et al.

(10) Patent No.: US 12,527,191 B2
(45) Date of Patent: Jan. 13, 2026

(54) PIXEL ARRANGEMENT STRUCTURE AND DISPLAY PANEL

(71) Applicant: YUNGU (GU'AN) TECHNOLOGY CO., LTD., Hebei (CN)

(72) Inventors: Mingxing Liu, Jiangsu (CN); Bing Han, Jiangsu (CN); Zeming Yang, Jiangsu (CN); Shuaiyan Gan, Jiangsu (CN)

(73) Assignee: YUNGU (GU'AN) TECHNOLOGY CO., LTD., Hebei (CN)

( * ) Notice: Subject to any disclaimer, the term of this patent is extended or adjusted under 35 U.S.C. 154(b) by 728 days.

(21) Appl. No.: 17/402,395

(22) Filed: Aug. 13, 2021

(65) Prior Publication Data
US 2021/0376010 A1 Dec. 2, 2021

Related U.S. Application Data
(63) Continuation of application No. PCT/CN2020/081226, filed on Mar. 25, 2020.

(30) Foreign Application Priority Data
Jul. 15, 2019 (CN) .......................... 20191063552.4

(51) Int. Cl.
H10K 59/35 (2023.01)
(52) U.S. Cl.
CPC ......... H10K 59/353 (2023.02); H10K 59/352 (2023.02)
(58) Field of Classification Search
CPC .......................................... H10K 59/351–353
See application file for complete search history.

(56) References Cited

U.S. PATENT DOCUMENTS

| | | | |
|---|---|---|---|
| 2013/0076236 A1* | 3/2013 | Sumida ............... | H10K 59/879 313/504 |
| 2017/0278906 A1* | 9/2017 | Song .................... | H10K 59/122 |

(Continued)

FOREIGN PATENT DOCUMENTS

| CN | 204614789 U | 9/2015 |
|---|---|---|
| CN | 106486076 A | 3/2017 |

(Continued)

OTHER PUBLICATIONS

International Search Report and Written Opinion (International Application No. PCT/CN2020/081226) with English Translation, dated May 22, 2020, 10 pages.

(Continued)

*Primary Examiner* — Eric K Ashbahian
(74) *Attorney, Agent, or Firm* — Quarles & Brady LLP (57) ABSTRACT

A pixel arrangement structure, including a plurality of pixel units arranged in an array. Each pixel unit includes a first pixel group and a second pixel group arranged adjacently along a first direction. Each of the first pixel group and the second pixel group includes three sub-pixels of different colors, and a first virtual triangle is formed by three straight lines connecting three centers of the three sub-pixels. An arranging manner of the sub-pixels in the second pixel group is the same as an arranging manner of the sub-pixels in the first pixel group, when the first pixel group is inverted by 180 degrees along a second direction, with respect to the second pixel group. Two lateral sides of the first virtual triangle form a first angle $\alpha$ and a second angle $\beta$ with respect to the first direction respectively, $30°\leq\alpha\leq60°$, $30°\leq\beta\leq60°$. The second direction is perpendicular to the first direction.

14 Claims, 10 Drawing Sheets

(56) References Cited

U.S. PATENT DOCUMENTS

| | | | |
|---|---|---|---|
| 2018/0226457 A1* | 8/2018 | Jin | H10K 59/353 |
| 2018/0261654 A1* | 9/2018 | Hwang | G09G 3/3225 |
| 2019/0019849 A1* | 1/2019 | Zheng | G02F 1/134336 |
| 2019/0164510 A1 | 5/2019 | Fang et al. | |
| 2020/0043988 A1* | 2/2020 | Zhang | G09G 3/3225 |
| 2021/0028247 A1* | 1/2021 | Long | H10K 59/353 |
| 2021/0335906 A1* | 10/2021 | Liu | H10K 59/80 |

FOREIGN PATENT DOCUMENTS

| | | |
|---|---|---|
| CN | 106783937 A | 5/2017 |
| CN | 206349366 U | 7/2017 |
| CN | 107942565 A | 4/2018 |
| CN | 107968104 A | 4/2018 |
| CN | 108198514 A | 6/2018 |
| CN | 108511480 A | 9/2018 |
| CN | 108807458 A | 11/2018 |
| CN | 110335892 A | 10/2019 |
| JP | 2004258365 A | 9/2004 |
| TW | 201835885 A | 10/2018 |
| WO | WO2018120366 A1 | 7/2018 |

OTHER PUBLICATIONS

Chinese First Office Action 100191 (CN Application No. 201910636552.4) and Search Result with English Translation, dated Aug. 20, 2020, 18 pages.

Chinese Second Office Action 100191 (CN Application No. 201910636552.4) with English Translation, dated Dec. 24, 2020, 7 pages.

Taiwan First Office Action (TW Application No. 109112281) and Search Result with English Translation, dated Feb. 5, 2021, 11 pages.

* cited by examiner

PIXEL ARRANGEMENT STRUCTURE AND DISPLAY PANEL

CROSS-REFERENCE TO RELATED APPLICATIONS

This application is a continuation application of International Application PCT/CN2020/081226, filed on Mar. 25, 2020, which claims priority of Chinese Patent Application No. 201910636552.4, filed on Jul. 15, 2019, and the disclosure of both applications are hereby incorporated by reference in their entirety.

TECHNICAL FIELD

This application relates to the field of display technology, in particular, to a pixel arrangement structure and a display panel.

BACKGROUND

With the continuous development of display technology, people have higher and higher requirements for the resolution of the display panel. With the advantages of high display quality, the applied range of high-resolution display panels is becoming wider and wider. Generally, the resolution of the display device may be improved by reducing the sizes of pixels and reducing the spacing between pixels. However, because of the reduction of the sizes of the pixels and the reduction of the spacing between the pixels, higher and higher requirements for the precision of a manufacturing process is needed, which will increase the difficulty of the manufacturing process of the display panel and increase the manufacturing cost.

On the other hand, a relatively small number of sub-pixels may analogy and achieve the same performance of the resolution of pixels by using the Sub-Pixel Rendering (SPR) technology, the Sub-Pixel Rendering (SPR) technology changes a common mode of a pixel defined by red, green, or blue sub-pixel by taking an advantage of the resolution differences sensed by the human eyes for the sub-pixels of different colors, and the Sub-Pixel Rendering (SPR) technology can share some sub-pixels of resolution-insensitive colors in some positions among different pixels. That is, the virtual resolution is improved. However, in such a pixel arrangement structure in the related art, a step shape is formed in an area adjacent to a special-shaped edge (for example, an arc-shaped edge) of the display area by the sub-pixels in different rows along the extending direction of the special-shaped edge. Therefore, when the display panel displays an image, a jagged feeling of an image becomes more serious in the area adjacent to the special-shaped edge, thus affecting the display effect of the display panel.

SUMMARY

Accordingly, it is necessary to provide a pixel arrangement structure, a display panel, and a display device, so as to reduce the jaggedness of the edge of the display area and improve the display effect.

According to one aspect of the present application, a pixel arrangement structure is provided. The pixel arrangement structure includes a plurality of pixel units arranged in an array. Each pixel unit includes a first pixel group and a second pixel group adjacently arranged along a first direction. Each of the first pixel group and the second pixel group includes three sub-pixels of different colors. A first virtual triangle is formed by three straight lines connecting three centers of the three sub-pixels in each of the first pixel group and the second pixel group.

An arranging manner of the sub-pixels in the second pixel group is the same as an arranging manner of the sub-pixels in the first pixel group, when the first pixel group is inverted by 180 degrees along a second direction, with respect to the second pixel group.

Two lateral sides of the first virtual triangle form a first angle $\alpha$ and a second angle $\beta$ with respect to the first direction respectively. $30°\leq\alpha\leq60°$, $30°\leq\beta\leq60°$.

The second direction and the first direction are perpendicular to each other.

In the above-described pixel arrangement structure, in each pixel unit, the sub-pixels of the same color in the first pixel group and in the second pixel group are staggered. In the same process conditions, a staggered manner of the sub-pixels expands an available distance between the openings of the same sub-pixels and reduces the difficulty of the mask manufacture process and the difficulty of the vapor deposition process, thus the size of the pixel group may be smaller, which is beneficial to the manufacture of the display panel with a high resolution. Moreover, the distance between the two adjacent sub-pixels of the same color in the first direction or in the second direction is relatively large, which is conducive to the transmission of the stretching force, thereby reducing deformation of the mask, and reducing the difficulty of the FMM manufacture process and the difficult of the vapor deposition process.

In addition, With the arrangement of the pixel units arranged in the array, a line, which is connecting edges of a plurality of sub-pixels adjacent to a special-shaped edge (for example, the arc-shaped edge) of the display area, tends to coincide with or to be parallel to a tangent line of the special-shaped edge, so that the line connecting the edges of the plurality of sub-pixels is smoother and approximate to the shape of the special-shaped edge, thereby reducing a jagged feel of an image adjacent to the special-shaped edge, and improving the display effect of the display panel. It should also be understood that in the pixel arrangement structure of the present application, the sub-pixels which are adjacent to the special-shaped edge of the display area include a plurality of colors, thereby preventing a colored edge from being formed at the edge of the display panel, and improving the display effect of the display panel.

According to another aspect of the present application, a pixel arrangement structure includes a plurality of rows of sub-pixels arranged along a second direction. Each row of the sub-pixels comprising a first sub-pixel, a second sub-pixel, and a third sub-pixel repeatedly arranged in sequence along a first direction.

the sub-pixels arranged in one column and a plurality of odd rows have a same color, the sub-pixels arranged in one column and a plurality of even rows have a same color, two sub-pixels of a same color respectively in adjacent rows are arranged in two different columns.

a first sub-pixel and an adjacent second sub-pixel arranged in a same row extending along the first direction are located at two sides of a center line of a closest third sub-pixel disposed in an adjacent row, and the center line extends along the second direction.

a first virtual triangle is formed by three straight lines connecting three centers of the first sub-pixel, the second sub-pixel and the third sub-pixel; the first sub-pixel and the second sub-pixel are arranged in a same row extending along the first direction and adjacent to each other, the third sub-pixel is disposed in an adjacent row and closest to the first sub-pixel and the second sub-pixel. Two lateral sides of the first virtual triangle form a first angle α and a second angle β with respect to the first direction respectively, and $30°≤α≤60°$, $30°≤β≤60°$.

The second direction and the first direction are perpendicular to each other.

According to yet another aspect of the present application, a display panel is provided, and the display panel includes the pixel arrangement structure of the embodiment above.

DETAILED DESCRIPTION OF THE EMBODIMENTS

As described in the background, at present most display panels display colors by using sub-pixels of three colors as primary colors, especially, taking RGB as three primary colors is the most common manner. Various approaches are available on colorization of an organic light-emitting diode (OLED) display screen, and a relatively mature and mass-produced colorization technology of OLED is an vapor deposition technology of OLED. In the vapor deposition technology of OLED, a conventional strip arrangement of RGB is used for vapor deposition. The side-by-side manner has the best display effect. Specifically, a pixel unit includes three sub-pixels of red, green, and blue (R, G, B). Each sub-pixel is rectangular-shaped, and has an independent organic light-emitting component. The organic light-emitting component is formed in a corresponding position of pixel disposed in an array substrate by vapor deposition technology of film-forming via a fine metal mask (FMM). The FMM is usually referred to as a mask of vapor deposition. The technical focus of manufacturing the OLED display screen with a high image resolution, namely, with a large number of pixels per inch (PPI), lies in the fineness and mechanical stability of the FMM and the arrangement of the pixels. Specifically, problems of warping and fracture of the FMM should be avoided as much as possible, thereby preventing the film layer of vapor deposition from dispersing and being offset to affect the quality of vapor deposition. The arrangement of pixels is the main factor that determines whether the FMM is prone to warp and fracture. That is, the arrangement of pixels and sub-pixels determines the mechanical properties of the FMM to a relatively large extent, and the mechanical properties of the FMM determine the quality of vapor deposition to a relatively large extent.

Figure 1:
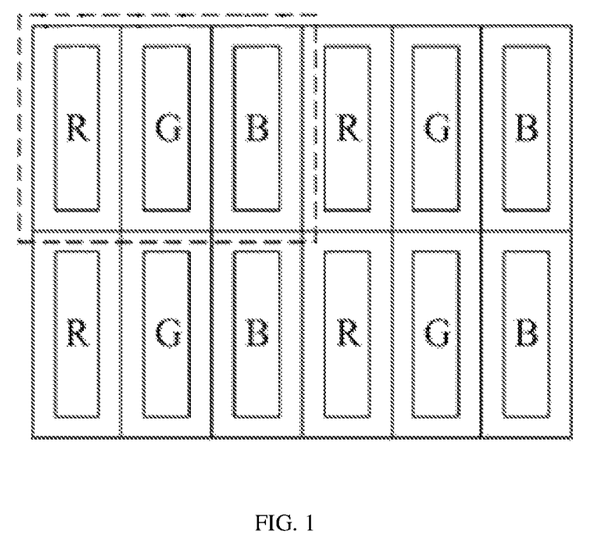
FIG. 1 is a schematic view illustrating an arrangement of a pixel arrangement structure.
Figure 2:
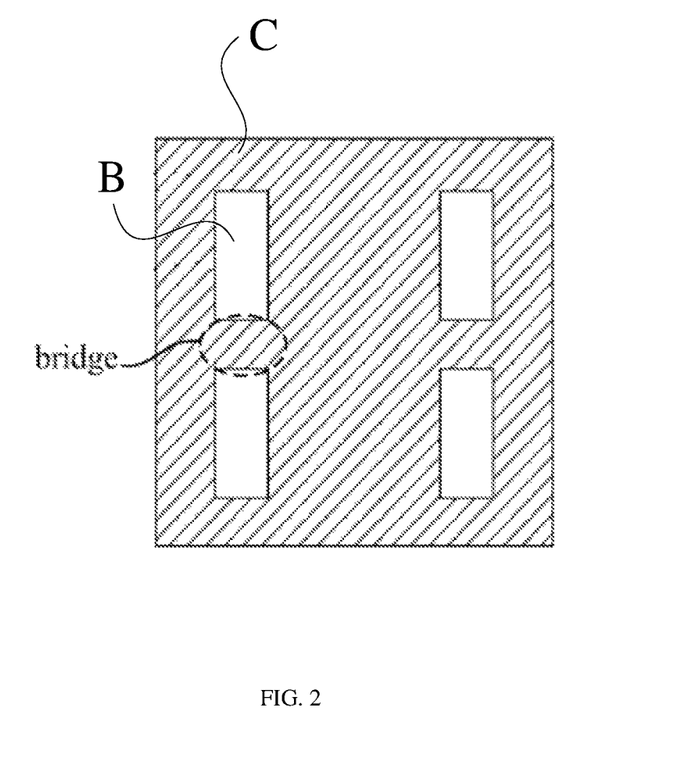
FIG. 2 is a schematic plan view of a fine metal mask (FMM) corresponding to the pixel arrangement structure of FIG. 1.

The pixel arrangement structure in the related art shown in FIG. 1 is formed by a process of vapor deposition using the FMM of FIG. 2. The FMM includes a plurality of openings B and shielding areas C. The shielding area between two adjacent openings B in the same column in the vertical direction is defined as a connecting bridge. In the arrangement shown in FIG. 1, since the sub-pixels of the same color are aligned to each other along a up and down direction, the openings B of the FMM need to be aligned to each other along a up and down direction as well, which causes the connecting bridge between the two longitudinally adjacent openings B to be exposed to fracturing. In addition, the opening B of the FMM needs to be corresponding to a predetermined position of the pixel. In such a pixel arrangement, the alignment space between the FMM and the sub-pixel area will be reduced, which may cause defects of color missing or color mixing. If the width of the connecting bridge is increased, the sizes of the sub-pixels will have to be reduced, thus affecting the opening ratio of the OLED display screen, which is not conducive to realization of high resolution.

Figure 3:
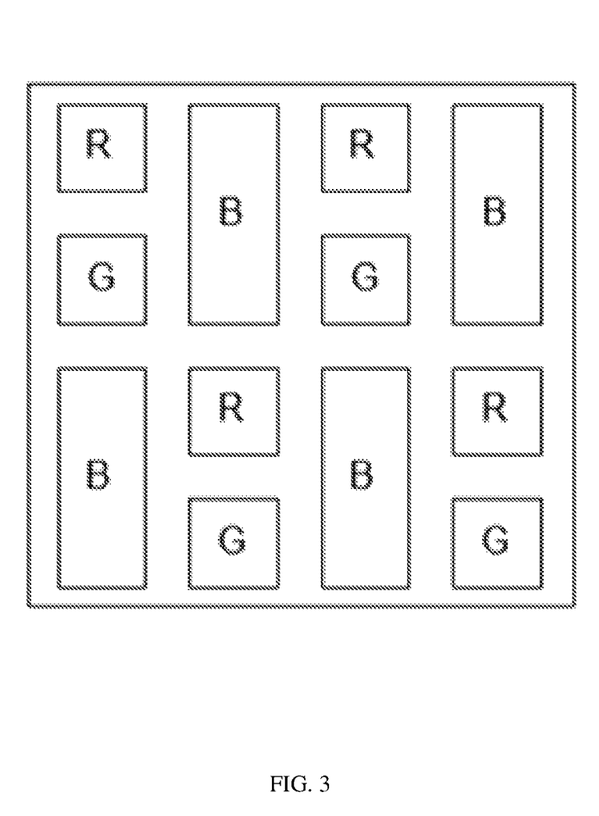
FIG. 3 is a schematic view illustrating an arrangement of another pixel arrangement structure.
Figure 4:
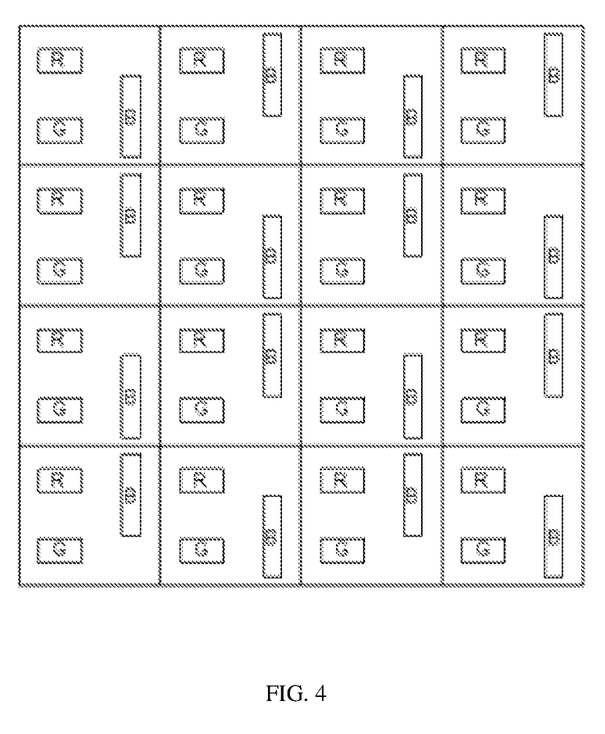
FIG. 4 is a schematic view illustrating an arrangement of yet another pixel arrangement structure.

FIG. 3 is a schematic view illustrating an arrangement of another pixel arrangement structure, and FIG. 4 is a schematic view illustrating an arrangement of yet another pixel arrangement structure. As shown in FIG. 3, the pixel arrangement structure includes a plurality of columns of sub-pixel along the vertical direction. Each column of the sub-pixels includes a sub-pixel R, a sub-pixel G, and a sub-pixel B arranged in a line. The sub-pixel B in each column of the sub-pixels faces the sub-pixel R and the sub-pixel G in an adjacent column of the sub-pixels thereof. As shown in FIG. 4, the pixel arrangement structure includes a plurality of units arranged in an array. Each unit includes a first column formed by a sub-pixel R and a sub-pixel G arranged in a line in the vertical direction, and a second column formed by a sub-pixel B. The pixel arrangement structures of FIG. 3 and FIG. 4 both may achieve a high resolution, but in the pixel arrangement structure of FIG. 3, the sub-pixel R, the sub-pixel G, and the sub-pixel B are arranged in a column, which increases the difficulty of the wiring of the array and the difficulty of the FMM manufacture and stretch. In the pixel arrangement structure of FIG. 4, the sub-pixel R and the sub-pixel G are arranged in the same column, which also increases the difficulty of the wiring of the array. Moreover, intervals between two adjacent sub-pixels B in the vertical direction are not uniform, and some of intervals between two adjacent sub-pixels B are relatively small, which is not conducive to the stretch of the FMM and affects the display effect.

Moreover, in the related art, by providing a slot/notch on the display screen, a camera, a speaker, and an infrared sensor element are arranged in the slot/notch area, and no pictures are displayed in the slot/notch area. The display area of the display screen has a special-shaped edge. In the above-mentioned three pixel arrangement structures, a jagged phenomenon appears in a part of the display area which is adjacent to the special-shaped edge. In the related configurations, a pixel group with lower brightness is arranged in the area which is adjacent to the special-shaped edge, so as to improve the jagged phenomenon, and a corresponding algorithm is configured in a driving chip to control the brightness. However, in the case that the algorithm is configured, the jagged phenomenon can be improved, but the complexity of the algorithmic is relatively increased, which increases the difficulty of the design of the driver chip.

In order to solve the above-mentioned problems, the present application provides a pixel arrangement structure, a display panel, and a display device, which can better solve these problems.

Figure 5:
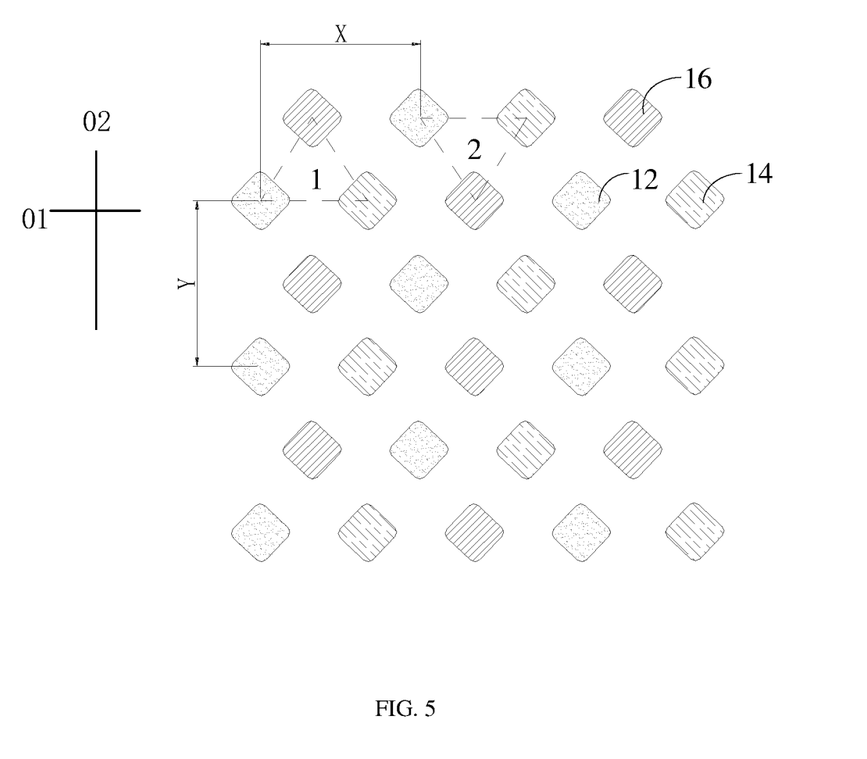
FIG. 5 is a schematic view illustrating an arrangement of a pixel arrangement structure of an embodiment of the present application.
Figure 6:
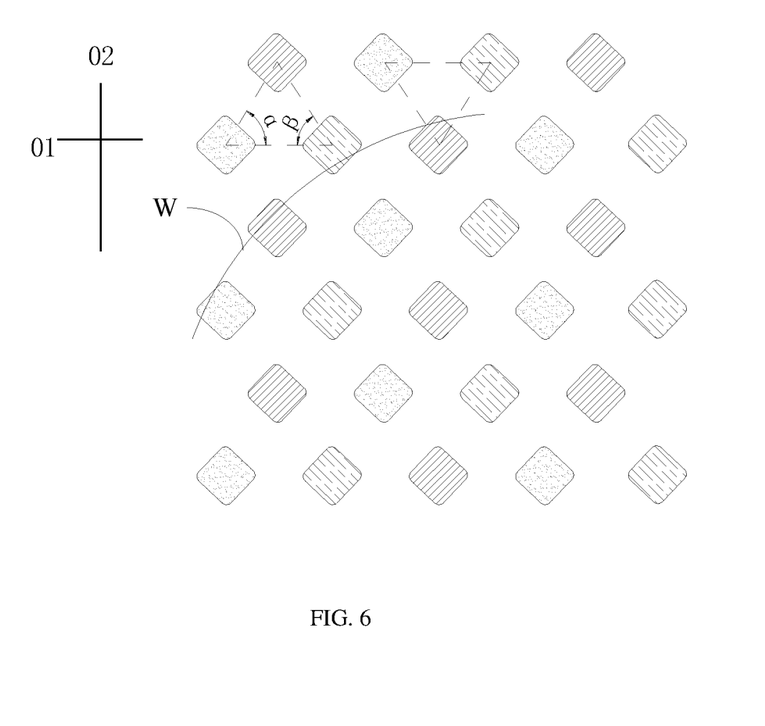
FIG. 6 is a schematic view illustrating a simulated arrangement of a part of the pixel arrangement structure which is adjacent to a special-shaped edge of the display area according to FIG. 5.
Figure 7:
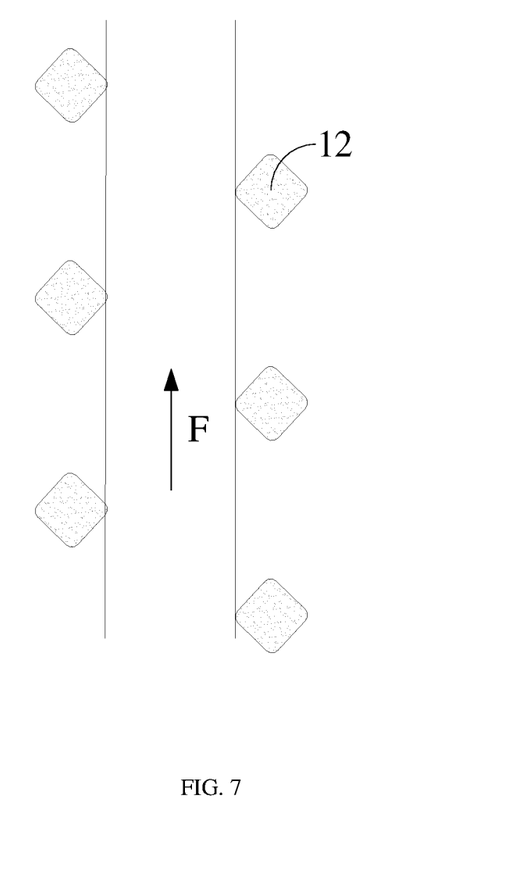
FIG. 7 is a schematic view illustrating a force on a stretched FMM of the pixel arrangement structure of FIG. 5.
Figure 8:
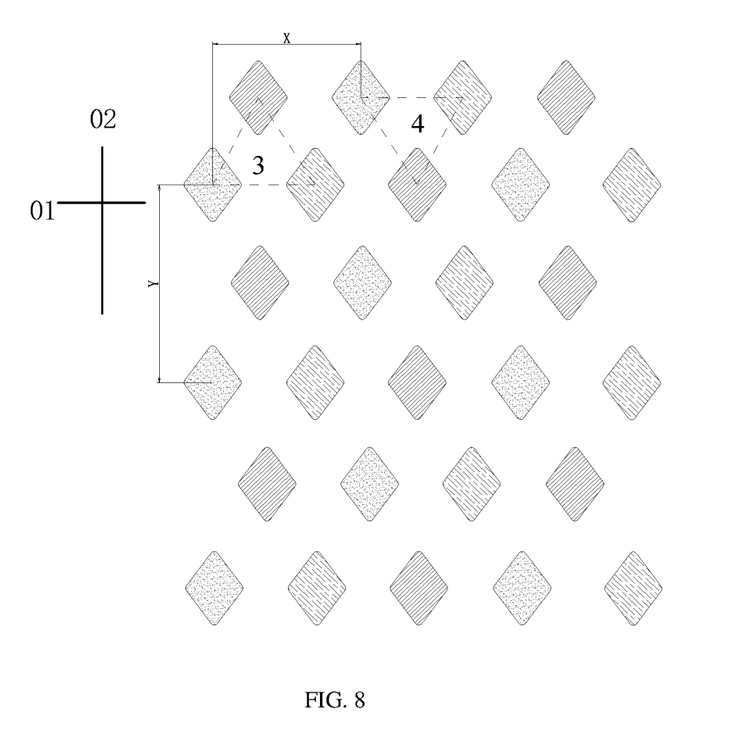
FIG. 8 is a schematic view illustrating an arrangement of a pixel arrangement structure according to another embodiment of the present application.

FIG. 5 is a schematic view illustrating an arrangement of a pixel arrangement structure of an embodiment of the present application. FIG. 6 is a schematic view illustrating a simulated arrangement of a part of the pixel arrangement structure which is adjacent to a special-shaped edge of the display area according to FIG. 5. FIG. 7 is a schematic view illustrating a force on a stretched FMM of the pixel arrangement structure of FIG. 5. FIG. 8 is a schematic view illustrating an arrangement of a pixel arrangement structure according to another embodiment of the present application.

Referring to FIG. 5, FIG. 6, and FIG. 8, the pixel arrangement structure of an embodiment of the present application includes a plurality of pixel units arranged in an array. Each pixel unit includes a first pixel group 1 and a second pixel group 2 that are adjacently arranged along a first direction 01. The first pixel group 1 includes three sub-pixels of different colors, and a first virtual triangle is formed by three straight lines connecting three centers of the three sub-pixels in the first pixel group 1. The second pixel group 2 includes three sub-pixels of different colors, and a first virtual triangle is formed by three straight lines connecting three centers of the three sub-pixels in the second pixel group 1. Specifically, each of the first pixel group and the second pixel group includes a first sub-pixel 12, a second sub-pixel 14, and a third sub-pixel 16 of different colors. The three sub-pixels are a red sub-pixel, a blue sub-pixel, and a green sub-pixel respectively. In some embodiments, the first sub-pixel 12 and the second sub-pixel 14 may be arranged in the same row extending along the first direction 01, and the third sub-pixel 16 may be arranged in another adjacent row extending along the first direction 01. Thus, the first virtual triangle is formed by three straight lines connecting three centers of the three sub-pixels.

In one of the embodiments, in each pixel unit, the first sub-pixel 12 and the second sub-pixel 14 which are disposed in the first pixel group 1 and the third sub-pixel 16 which is disposed in the second pixel group 2 are arranged in the same row extending along the first direction 01. Specifically, the pixel arrangement structure may include a plurality of rows of the sub-pixels, each row of the sub-pixels are extending along the first direction 01. Each row of the sub-pixels includes the first sub-pixel 12, the second sub-pixel 14 and the third sub-pixel 16 repeatedly arranged in sequence. A pixel group is formed by the first sub-pixel 12, the second sub-pixel 14 and the third sub-pixel 16; the first sub-pixel 12 and second sub-pixel 14 are arranged in the same row, the third sub-pixel 16 is disposed in an adjacent row and closest to the first sub-pixel 12 and second sub-pixel 14. In this case, the sub-pixels in the pixel arrangement structure may be arranged in rows, thus the arrangement of the sub-pixels is more uniform, and the display effect is better.

In each pixel unit, an arranging manner of the sub-pixels in the second pixel group 2 is the same as an arranging manner of the sub-pixels in the first pixel group 1, when the first pixel group is inverted by 180 degrees along a second direction, with respect to the second pixel group. In one of the embodiments, as shown in FIG. 5, each pixel unit includes the first pixel group 1 and the second pixel group 2 arranged adjacently along the first direction 01, an arranging manner of the sub-pixels in the second pixel group 2 is the same as an arranging manner of the sub-pixels in the first pixel group 1, when the first pixel group is inverted by 180 degrees along a second direction, with respect to the second pixel group; and in the second direction, the arranging manners of the sub-pixels of the pixel groups in a same column are same. Correspondingly, in some embodiments, each pixel unit of the pixel arrangement structure may include the first pixel group and the second pixel group adjacently arranged along the second direction 02, and an arranging manner of the sub-pixels in the second pixel group 2 is the same as an arranging manner of the sub-pixels in the first pixel group 1, when the first pixel group is inverted by 180 degrees along a second direction, with respect to the second pixel group; and in the first direction, the arranging manners of the sub-pixels of the pixel groups in a same row are same. In this case, in the pixel arrangement structure, the pixel groups can be arranged more closely, thereby reducing the spacing between pixels, and increasing the image resolution, that is, increasing the number of points per inch (PPI).

As shown in FIGS. 5 and 6, in an embodiment of the present application, the first virtual triangle is formed by three straight lines connecting three centers of the three sub-pixels in each pixel group. Two lateral sides of the first virtual triangle form a first angle $\alpha$ and a second angle $\beta$ with respect to the first direction 01 respectively and $30°\leq\alpha\leq60°$ and $30°\leq\beta\leq60°$. One side of the triangle is defined as a bottom side and the other two sides are defined as the lateral sides. In the embodiment of the present application, in each pixel unit, the first pixel group 1 and the second pixel group 2 are arranged adjacently along the first direction 01, and an arranging manner of the sub-pixels in the second pixel group 2 is the same as an arranging manner of the sub-pixels in the first pixel group 1, when the first pixel group is inverted by 180 degrees along a second direction, with respect to the second pixel group. The bottom side of the first virtual triangle is parallel to the first direction 01, and a vertex of the first virtual triangle is a point facing to the bottom side. The lateral sides of the first virtual triangle are the other two sides of the first virtual triangle. Specifically, as shown in FIG. 5 and FIG. 6, the bottom side of the first virtual triangle is formed by the sub-pixels in the first pixel group 1 or in the second pixel group 2, that is, the bottom side is facing to the center of the third pixel 16, the bottom side is parallel to the first direction 01. In each of the first pixel group 1 and the second pixel group 2, the two lateral sides of the first virtual triangle form the first angle $\alpha$ and the second angle $\beta$ with respect to the first direction 01.

It should be understood that the sub-pixels of different colors in each row of the sub-pixels in the first direction 01 are repeatedly arranged in sequence. In each pixel unit, an arranging manner of the sub-pixels in the second pixel group 2 is the same as an arranging manner of the sub-pixels in the first pixel group 1, when the first pixel group is inverted by 180 degrees along a second direction, with respect to the second pixel group. The two lateral sides of the first virtual triangle formed by three straight lines connecting three centers of the three sub-pixels in each pixel group form the first angle $\alpha$ and the second angle $\beta$ with respect to the first direction 01. In this case, with a plurality of same pixel units arranged in an array, a line, which connects edges of a plurality of sub-pixels disposed in the display area which is adjacent to a special-shaped edge W (for example, the arc-shaped edge), tends to coincide with or to be parallel to a tangent line of the special-shaped edge W, so that the line connecting the edges of the plurality of sub-pixels is smoother and approximate to the shape of the special-shaped edge W, thereby reducing a jagged feeling of an image in the display area which is adjacent to the special-shaped edge W, and improving the display effect of the display panel. It should also be understood that in the pixel arrangement structure of the present application, the sub-pixels disposed in the display area which is adjacent to the special-shaped edge W may include a plurality of colors, thereby preventing a colored edge from being formed at the edge of the display panel, and improving the display effect of the display panel.

It should be noted that in the condition of the same display area and the same large number of PPIs, a shape and a size of each sub-pixel, and distances between centers of the sub-pixels in the pixel group may change angles formed by the two lateral sides of the virtual triangle with respect to the first direction 01. It is understood that in the condition of the same display area and the same large number of PPIs, for the pixel arrangement structure of the present application, if the first angle α and the second angle β are kept within a range from 30 degrees to 60 degrees, just by changing the shape and the size of each sub-pixel and the distances between sub-pixels for different display areas, the jagged feeling of the image of the display area which is adjacent to the special-shaped edge can be effectively reduced. Compared with the pixel arrangement structure in the related art, the pixel arrangement structure of the present application is more applicable for products of different configurations, thereby effectively reducing design and manufacture costs.

In some embodiments of the present application, the sub-pixels in the same column extending along the second direction 02 have the same color. As shown in FIG. 5 and FIG. 8, centers of the sub-pixels of the same color in the pixel groups in the same column extending along the second direction 02 are arranged in a straight line. The sub-pixels of the same color in two adjacent rows which are extending along the first direction 01 are arranged in a staggered manner along the second direction 02, that is, the sub-pixels of the same color in two adjacent rows are arranged in different columns which are extending along the second direction 02. In the same row of the sub-pixels which are extending along the first direction 01, the first sub-pixel 12 and the adjacent second sub-pixel 14 are located at two sides of a center line of the third sub-pixel 16 disposed in an adjacent row, the center line is extending along the second direction 02. In other words, the arrangements of sub-pixels in all odd rows extending along the first direction 01 are same, and the arrangements of sub-pixels in all even rows are same as well. However, the light-emitting areas of the sub-pixels of the same color in any two adjacent rows are not arranged to be aligned to each other along an up and down direction, but are arranged in a staggered manner. Moreover, the light-emitting areas of the sub-pixels of the pixel groups in the same column along the second direction 02 are arranged to be aligned to each other along an up and down direction. Specifically, as shown in FIGS. 5 and 6, in the pixel groups in the same column extending along the second direction 02, centers of all first sub-pixels 12 are located in a first straight line, the centers of all the second sub-pixels 14 are located in a second straight line, and centers of all third sub-pixels 16 are located in a third straight line.

In this case, on one hand, each pixel group in the pixel arrangement structure includes three colors (RGB), which may realize a true full-color display. In addition, in the pixel arrangement structure, in the row of the sub-pixels extending along the first direction 01, the sub-pixels of three colors are repeatedly arranged in sequence. In the second direction 02, the distance between the sub-pixels of the same color is relatively wide. Compared with the pixel arrangement structure in the related art, in which sub-pixels of one color are densely arranged in a certain direction, the pixel arrangement structure of the present application has a uniform display effect in the first direction and in the second direction, and has a better display effect. On the other hand, in each pixel unit, the sub-pixels of the same color in the first pixel group and the second pixel group are arranged in a staggered manner. Under the same process condition, the pixel arrangement structure with a staggered manner of the sub-pixels expands the available distance between the openings of the same sub-pixels and reduces the difficulty of the mask manufacture process and the difficulty of the vapor deposition process, thus the size of the pixel group may be made smaller, which is beneficial to the manufacture of the display screen with a high resolution. Moreover, the distance between the two adjacent sub-pixels of the same color in the first direction 01 or in the second direction 02 is relatively large, which is conducive to the transmission of the stretching force F, thereby reducing deformation of the mask, and reducing the difficulty of the FMM manufacture process and the difficulty of the vapor deposition process.

On one hand again, the centers of the sub-pixels of the same color in the pixel groups in the same column extending in the second direction 02 are located in a straight line, and the wiring of the pixel unit array connecting the sub-pixels can be arranged in a line, which is convenient for the arrangement of the wiring of the pixel unit array, and beneficial to a reduction of a distance between an anode via and a pixel definition layer, thereby reducing the difficulty of the manufacture of the display panel, and facilitating the manufacture of the display screen with the high resolution.

It is understood that, since the luminous efficiency of the blue sub-pixel B is usually the lowest, the light-emitting area needs to be larger. Therefore, in some embodiments, the area of the sub-pixel B is larger than that of the red sub-pixel R, and larger than that of the green sub-pixel G. Specifically, in some embodiments, the first sub-pixel 12 is a green sub-pixel, the second sub-pixel 14 is a red sub-pixel, and the third sub-pixel 16 is a blue sub-pixel. The opening area of the third sub-pixel 16 is larger than that of the first sub-pixel 12, and larger than that of the second sub-pixel 14. In addition, the opening area of the first sub-pixel 12 may be equal to the opening area of the second sub-pixel 14, so that the pixel arrangement structure has a better display effect.

It should be noted that the opening area of the first sub-pixel 12 may not be equal to the opening area of the second sub-pixel 14. In a practical application, the opening area of each sub-pixel may be adjusted according to actual requirements.

In some embodiments of the present application, the plurality of sub-pixels have the same shape. In some embodiments, the shapes of the first sub-pixel 12, the second sub-pixel 14, and the third sub-pixel 16 may be triangles, quadrilaterals or other polygons, etc., which are not limited herein. In this case, it may be ensured that the pixels are arranged more uniformly, and the line connecting the edges of the sub-pixels which are adjacent to the special-shaped edge W of the display area is smoother, thereby further reducing the jagged feeling of the special-shaped edge W of the display area. In one of the embodiments, the shape of the sub-pixel may be a rhombus. In this case, on one hand, the sub-pixels in the pixel groups may be arranged to be more close, which is beneficial to an increase of the opening ratio of the display panel. On the other hand, edges of the sub-pixel are arranged to form angles with respect to the first direction 01, and the corresponding edges of each sub-pixel are approximately parallel to the lateral sides of the first virtual triangle mentioned above, thereby further reducing the jagged feeling of special-shaped edge W of the display areas, and improving the display effect.

In some embodiments of the present application, in each pixel group, the center line of the third sub-pixel 16, which extends along the second direction 02, coincides with a perpendicular bisector of a straight line connecting a center of the first sub-pixel 12 and a center of the second sub-pixel 14. In this case, the first virtual triangle is an isosceles triangle, and the first sub-pixel 12, the second sub-pixel 14, and the third sub-pixel 16 are uniformly distributed, and the display effect is better. In some embodiments, for a plurality of rows of sub-pixels each extending along the first direction 01, in two adjacent rows, the sub-pixels of the same color (such as the first sub-pixels 12) are arranged to stagger M sub-pixels. That is, a projection distance along the first direction 01 is a width of the M sub-pixels, wherein a projection distance comes from a distance between the midpoints of the light-emitting areas of two sub-pixels of the same color which are closest to each other in two adjacent rows. Another distance is a width of N sub-pixels, wherein the other distance is a distance between the midpoints of the two sub-pixels of the same color which are closest to each other in the same row. When the sub-pixels have the same shape and the same size, N=2M. It should be noted that in each pixel group, the center line of the third sub-pixel 16, which extends along the second direction 02, coincides with the perpendicular bisector of the straight line connecting the center of the first sub-pixel 12 and the center of the second sub-pixel 14 which are arranged in the adjacent row, and the display effect is better. However, in some other embodiments, for a plurality of rows of the sub-pixels, each row is extending along the first direction 01, in two adjacent rows, the sub-pixels of the same color may be arranged to stagger a distance which is not strictly limited to the width of M sub-pixels. That is, the perpendicular bisector of the straight line, which is connecting the center of the first sub-pixel 12 and the center of the second sub-pixel 14 which are adjacent to each other, and the center line of the third sub-pixel 16 disposed in the adjacent row may be spaced apart by a certain distance in the first direction 01, the center line of the third sub-pixel 16 extends along the second direction 02.

In some embodiments of the present application, a distance between two sub-pixels of a same color respectively disposed in two adjacent sub-pixel groups along the first direction is a first distance, a distance between two sub-pixels of a same color respectively disposed in two adjacent sub-pixel groups along the second direction is a second distance. The ratio of the first distance to the second distance is 2N/(N+1), N is an integer greater than or equal to 1. As shown in FIG. 5, the distance in the first direction 01 between two first sub-pixels 12 respectively disposed in the first pixel group 1 and the adjacent second pixel group 2 along the first direction 01 is X, the distance in the second direction 02 between two first sub-pixels 12 respectively disposed in two adjacent first pixel groups along the second direction 02 is Y. N=1, that is, X=Y. In the embodiment shown in FIG. 8, N=2, that is, the distance in the first direction 01 between two first sub-pixels 12 respectively disposed in a third pixel group 3 and an adjacent fourth pixel group 4 along the first direction 01 is X, the distance in the second direction 02 between two first sub-pixels 12 respectively disposed in two adjacent third pixel groups 3 along the second direction 02 is Y, and it is satisfied that Y=4/3X.

In the pixel arrangement structure, on one hand, the pixel group in a certain direction is equivalent to the pixel group of (P+1)/P times in the real pixel arrangement structure, thereby increasing a virtual resolution of the display device. For example, when P=2, two pixel groups in the first direction 01 realize the display effect of three pixel groups in the real pixel arrangement structure. In a specific product, a total of 780 pixel groups in the first direction 01 may achieve the display effect of 1280 pixel groups in the real pixel arrangement structure, thereby increasing the virtual resolution of the display panel. On the other hand, the sub-pixels are arranged uniformly, so that the line, which connects the edges of the plurality of sub-pixels which is adjacent to the special-shaped edge W (for example, the arc-shaped edge) of the display area, tends to coincide with or to be parallel to a tangent line of the special-shaped edge W. Further, the line connecting the edges of the plurality of sub-pixels is smoother and approximate to the shape of the special-shaped edge W, thereby reducing the jagged feeling of the image of the display area at the special-shaped edge W, and improving the display effect of the display panel.

In one of the embodiments, a distance between two sub-pixels of a same color respectively disposed in two adjacent sub-pixel groups along the first direction is a first distance, a distance between two sub-pixels of a same color respectively disposed in two adjacent sub-pixel groups along the second direction is a second distance, and the ratio of the first distance to the second distance is 1:1, that is, the aforementioned N is equal to 1. In this case, not only the sub-pixels are arranged more uniformly, thereby improving the virtual resolution of the display device, but also the line which connects the edges of the plurality of sub-pixels which is adjacent to the special-shaped edge W (for example, the arc-shaped edge) of the display area tends to coincide with or to be parallel with the tangent line of the special-shaped edge W, thereby greatly reducing the jagged feeling of the image of the display area adjacent to the special-shaped edge W. It should be noted that in some embodiments, the centers of the sub-pixels of the same color in the pixel groups in the same column extending along the second direction 02 are located in a straight line. Therefore, the distance between the sub-pixels of the same color in the two adjacent pixel groups in the second direction 02 is the distance between centers of the two sub-pixels. However, the sub-pixels of the same color in the two adjacent pixel groups in the first direction 01 are arranged in two adjacent sub-pixel rows respectively. Therefore, the distance in the first direction 01 between the sub-pixels of the same color in two adjacent pixel groups in the first direction 01 is a distance between the center lines of the sub-pixels of the same color along the second direction 02.

In the foregoing embodiments, the first direction 01 is a transverse direction namely a horizontal direction shown in FIG. 5 or FIG. 8, and the second direction 02 is a longitudinal direction namely a vertical direction shown in FIG. 5 or FIG. 8. In some embodiments, the first direction 01 is the longitudinal direction namely the vertical direction, and the second direction 02 is the transverse direction namely the horizontal direction. That is, the pixel arrangement structures of these embodiments are obtained by rotating the pixel arrangement structures shown in FIG. 5 or FIG. 8 by 90 degrees or 270 degrees. The first direction 01 and the second direction 02 are perpendicular to each other.

It should be understood that other appropriate deformations may be made for the above pixel arrangement structures. For example, the pixel arrangement structures can be rotated by 180 degrees, or the positions of the first sub-pixel 12, the second sub-pixel 14 and the third sub-pixel 16 are interchanged. These deformations will not be described in detail.

Figure 9:
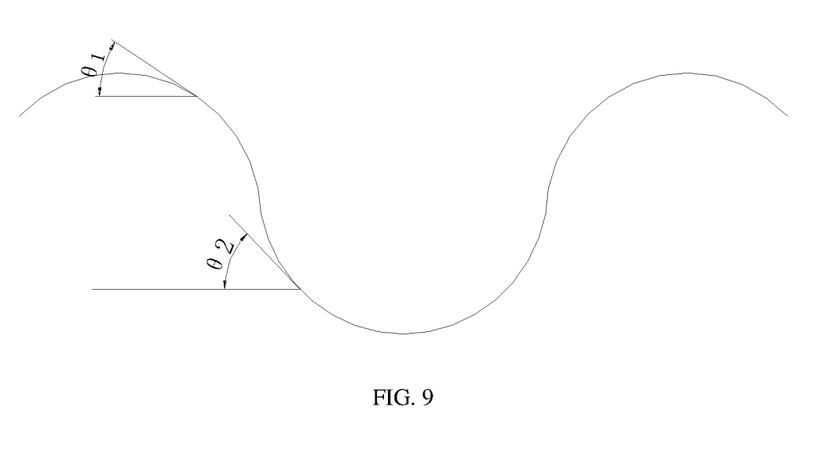
FIG. 9 is a schematic plan view illustrating a special-shaped edge of the display area according to an embodiment of the present application.
Figure 10:
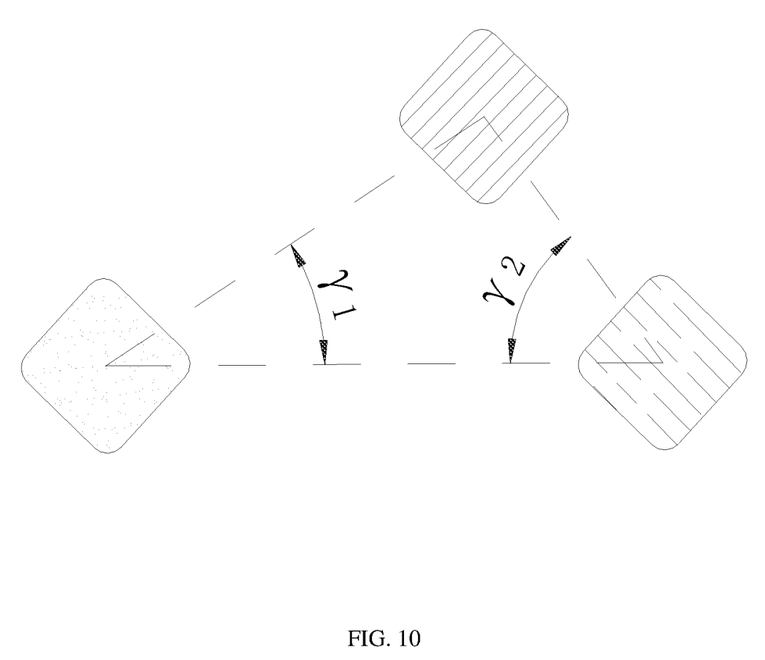
FIG. 10 is a schematic view illustrating an arrangement of a plurality of edge display units according to an embodiment of the present application.

FIG. 9 is a schematic plan view illustrating a special-shaped edge of the display area according to an embodiment of the present application, and FIG. 10 is a schematic view illustrating an arrangement of a plurality of edge display units according to an embodiment of the present application.

In some embodiments, the pixel arrangement structure further includes at least one edge display unit which is independent of the plurality of pixel units arranged in the array, and the at least one edge display unit is arranged to be adjacent to the pixel groups of the pixel units arranged in the array and adjacent to the special-shaped edge of the display area. Specifically, the display panel has a contour line that may define an effective display area. The effective display area may include an edge display area adjacent to the contour line and a main display area away from the contour line. An edge display area refers to a part of the display area which is adjacent to the special-shaped contour line. The edge display unit includes three sub-pixels of different colors. A second virtual triangle is formed by three straight lines connecting three centers of the three sub-pixels of the edge display unit. Two lateral sides of the second virtual triangle form a third angle $\gamma_1$ and a four angle $\gamma_2$ with respect to the first direction 01 respectively. The third angle $\gamma_1$ is formed between a lateral side of the second virtual triangle and the first direction 01, the lateral side of the second virtual triangle is adjacent to the special-shaped edge of the display area; and the third angle $\gamma_1$ is not equal to the first angle $\alpha$ or the second angle $\beta$. Specifically, in the embodiment shown in FIG. 10, $\gamma_1 < \gamma_2 = \alpha = \beta$, that is, the first sub-pixel 12 in the pixel group of a pixel unit inclines towards the special-shaped edge of the display area to form the edge display unit, thus the corresponding angle is adjusted to adapt to different special-shaped edges of the display area. In one of the embodiments, $30° \leq \gamma_1 \leq 60°$, and $30° \leq \gamma_2 \leq 60°$.

It should be understood that, in some embodiments, the special-shaped edge of the display area is an arc line. If the arc line is relatively regular, that is, if a tangent angle of the arc line does not change or has a small change, the first angle $\alpha$ is configured to be equal to the second angle $\beta$ (as shown in the embodiment of FIG. 6), which may effectively reduce the jagged feeling of the special-shaped edge of the display area. In other embodiments, a change of the tangent angle of the arc line is great. For example, in the embodiment shown in FIG. 9, the tangent angles $\theta_1$ and $\theta_2$ at different positions of the special-shaped edge of the display area are not equal. In this case, the third angle $\gamma_1$ between the first direction 01 and one lateral side of the second virtual triangle formed by the straight lines connecting the centers of the three sub-pixels in the edge display unit is not equal to the first angle $\alpha$ or the second angle $\beta$. In this case, the tangent lines at different positions of the special-shaped edge of the display area tend to coincide or parallel to a line, which connects edges of the sub-pixels in the edge display unit and/or edges of the sub-pixels in the pixel groups adjacent to the special-shaped edge, so that line connecting the edges of the plurality of sub-pixels is smoother and approximate to the shape of the special-shaped edge, thereby reducing the jagged feeling of the image of the display area adjacent to the special-shaped edge, and improving the display effect of the display panel.

It can be understood that the number of the edge display units may be determined according to actual conditions, and the third angle $\gamma_1$ and the fourth angle $\gamma_2$ of the second virtual triangle in at least one edge display unit may be determined according to actual conditions, which are not limited herein. In some embodiments, the pixel arrangement structure includes a plurality of edge display units, and the third angles $\gamma_1$ of the second virtual triangles in the plurality of edge display units may be same or different from each other. Correspondingly, the fourth angles $\gamma_2$ in the plurality of edge display units may be same, or partially same, or different from each other.

It is also understood that the main factor affecting the jagged feeling is the arrangement of the sub-pixels adjacent to the special-shaped edge of the display area. Therefore, in one of the embodiments, the fourth angle $\gamma_2$ of the second virtual triangle may be equal to the first angle $\alpha$ or the second angle $\beta$ of the first virtual triangle, and the third angle $\gamma_1$ of the second virtual triangle is not equal to the first angle $\alpha$, the second angle $\beta$, and the fourth angle $\gamma_2$. In this case, the display of other sub-pixels is not affected, the sub-pixels are uniformly arranged, and the tangent lines at different positions of the special-shaped edge of the display area tend to coincide or parallel to the line, which connects the edges of the sub-pixels in the edge display unit and/or the edges of the sub-pixels in the pixel groups adjacent to the special-shaped edge, thereby reducing the jagged feeling.

It should be noted that, in the embodiments of the present application, the bottom side of the second virtual triangle is the side which is facing to the vertex of the second virtual triangle, and the lateral sides are the other two sides. Wherein, the vertex of the second virtual triangle is a center of the sub-pixel in the edge display unit, and the sub-pixel in the edge display unit and the sub-pixel in the adjacent pixel group are arranged in different rows, and the vertex of the first virtual triangle is a center of the sub-pixel in the adjacent pixel group.

Based on the above-mentioned pixel arrangement structure, an embodiment of the present application further provides a display panel including the above-mentioned pixel arrangement structure.

The display panel may be an OLED light-emitting display panel, a liquid crystal display panel, a Micro LED, a quantum dot display panel, etc., which are not limited herein. Specifically, the display panel further includes pixel drive circuits (not shown) connected to the sub-pixels in a one-to-one correspondence. In one of the embodiments, the display panel further includes data signal driving circuits and scanning signal driving circuits which are arranged in a frame area, this is not limited herein. In the embodiments of the display panel of the present application, one sub-pixel may be connected to one pixel driving circuit, and the sub-pixel may be used as the smallest unit for pixel sharing during display, thereby achieving a high pixel virtual resolution.

Based on the same inventive concept, the present application further provides a display device, which includes the display panel of the foregoing embodiment.

Specifically, the display device may be applied to fields such as mobile phone terminals, bionic electronics, electronic skins, wearable devices, vehicle-mounted devices, Internet of Things devices, and artificial intelligence devices. For example, the above-mentioned display device may be a digital device such as a mobile phone, a tablet, a handheld computer, an iPod, or a smart watch.

What is claimed is:

1. A pixel arrangement structure comprising a plurality of pixel units arranged in an array, each pixel unit comprising a first pixel group and a second pixel group adjacently arranged along a first direction, each of the first pixel group and the second pixel group comprising three sub-pixels of different colors, wherein
- a first virtual triangle is formed by three straight lines connecting three centers of the three sub-pixels in each of the first pixel group and the second pixel group;
- an arranging manner of the sub-pixels in the second pixel group is the same as an arranging manner of the sub-pixels in the first pixel group, when the first pixel group is inverted by 180 degrees along a second direction, with respect to the second pixel group; sub-pixels disposed in a same column in the second direction have a same color;
- two lateral sides of the first virtual triangle form a first angle $\alpha$ and a second angle $\beta$ with respect to the first direction respectively; $30°\leq\alpha\leq60°$, $30°\leq\beta\leq60°$;
- the second direction and the first direction are perpendicular to each other;
- the pixel arrangement structure further comprises at least one edge display unit which is independent of the plurality of pixel units arranged in the array, wherein the at least one edge display unit is adjacent to a special-shaped edge of a display area;
- each of the at least one edge display unit comprises three sub-pixels of different colors, the three sub-pixels of each of the at least one edge display unit have a same shape, and a second virtual triangle is formed by three straight lines connecting three centers of the three sub-pixels in each of the at least one edge display unit;
- two lateral sides of the second virtual triangle form a third angle $\gamma_1$ and a fourth angle $\gamma_2$ with respect to the first direction respectively;
- the third angle $\gamma_1$ is formed between a lateral side of the second virtual triangle and the first direction, and the lateral side of the second virtual triangle is adjacent to the special-shaped edge of the display area; and
- the third angle $\gamma_1$ is smaller than the fourth angle $\gamma_2$; the fourth angle $\gamma_2$ is equal to the first angle $\alpha$ and the second angle $\beta$.

2. The pixel arrangement structure according to claim 1, wherein the three sub-pixels of each pixel unit have a same shape.

3. The pixel arrangement structure according to claim 2, wherein the shape of each of the three sub-pixels is a rhombus.

4. The pixel arrangement structure according to claim 1, wherein the three sub-pixels are the first sub-pixel, the second sub-pixel and the third sub-pixel;
- the first sub-pixel and the second sub-pixel are arranged in a row along the first direction; and the third sub-pixel is arranged in another adjacent row.

5. The pixel arrangement structure according to claim 4, wherein in each pixel unit, the first sub-pixel and the second sub-pixel disposed in one pixel group are arranged in a same row with the third sub-pixel disposed in another pixel group in the first direction.

6. The pixel arrangement structure according to claim 4, wherein the three sub-pixels comprises a red sub-pixel, a green sub-pixel and a blue sub-pixel.

7. The pixel arrangement structure according to claim 6, wherein an area of the blue sub-pixel is larger than an area of the red sub-pixel, and the area of the blue sub-pixel is larger than an area of the green sub-pixel.

8. The pixel arrangement structure according to claim 4, wherein a center line of the third sub-pixel extending along the second direction coincides with a perpendicular bisector of a straight line connecting a center of the first sub-pixel and a center of the second sub-pixel.

9. The pixel arrangement structure according to claim 2, wherein the three sub-pixels have a same size.

10. The pixel arrangement structure of claim 4, wherein the first sub-pixel is a green sub-pixel; the second sub-pixel is a red sub-pixel; the third sub-pixel is a blue sub-pixel; an opening area of the third sub-pixel is larger than an opening area of the first sub-pixel; and the opening area of the third sub-pixel is larger than an opening area of the second sub-pixel.

11. The pixel arrangement structure of claim 10, wherein the opening area of the first sub-pixel is equal to the opening area of the second sub-pixel.

12. A display panel, comprising the pixel arrangement structure according to claim 1.

13. The pixel arrangement structure of claim 1, wherein M denotes a projection distance along the first direction of a distance between midpoints of light-emitting areas of at least two sub-pixels of the same color which are closest to each other in two adjacent rows; N denotes another distance between midpoints of at least two sub-pixels of the same color which are closest to each other in the same row; the sub-pixels have the same shape and the same size; and $N=2M$ is satisfied.

14. The pixel arrangement structure according to claim 1, wherein in the first direction, a distance between at least two sub-pixels of a same color respectively disposed in two adjacent pixel groups is a first distance; in the second direction, a distance between at least two sub-pixels of a same color respectively disposed in two adjacent pixel groups is a second distance; a ratio of the first distance to the second distance is $2N/(N+1)$; and
N is an integer greater than or equal to 1.

* * * * *